United States Patent
Park (10) Patent No.: US 10,108,561 B2
(45) Date of Patent: Oct. 23, 2018

(54) DATA STORAGE DEVICE AND OPERATING METHOD THEREOF

(71) Applicant: SK hynix Inc., Gyeonggi-do (KR)

(72) Inventor: Jeen Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/701,767

(22) Filed: Sep. 12, 2017

(65) Prior Publication Data
US 2018/0225234 A1 Aug. 9, 2018

(30) Foreign Application Priority Data
Feb. 9, 2017 (KR) .................. 10-2017-0018090

(51) Int. Cl.
| | |
|---|---|
| G11C 5/14 | (2006.01) |
| G06F 13/16 | (2006.01) |
| G11C 16/34 | (2006.01) |
| G11C 16/30 | (2006.01) |
| G11C 17/18 | (2006.01) |
| G11C 29/52 | (2006.01) |
| G11C 11/56 | (2006.01) |
| G11C 16/04 | (2006.01) |
| G11C 29/06 | (2006.01) |
| G11C 29/44 | (2006.01) |

(52) U.S. Cl.
CPC .......... *G06F 13/1668* (2013.01); *G11C 5/144* (2013.01); *G11C 11/5628* (2013.01); *G11C 16/0483* (2013.01); *G11C 16/30* (2013.01); *G11C 16/3445* (2013.01); *G11C 17/18* (2013.01); *G11C 29/06* (2013.01); *G11C 29/44* (2013.01); *G11C 29/52* (2013.01); *G11C 2029/4402* (2013.01)

(58) Field of Classification Search
CPC . G06F 13/1668; G11C 5/144; G11C 11/5628; G11C 16/0438
USPC ......................................... 365/228, 229, 226
See application file for complete search history.

(56) References Cited

U.S. PATENT DOCUMENTS

2005/0169082 A1* 8/2005 Cernea .................. G11C 7/062
365/218

FOREIGN PATENT DOCUMENTS

KR 1020050007907 1/2005

* cited by examiner

*Primary Examiner* — Vu Le
(74) *Attorney, Agent, or Firm* — IP & T GROUP LLP

(57) ABSTRACT

A data storage device includes a nonvolatile memory device; a power management unit suitable for outputting first and second low voltage detection signals, each low voltage detection signal representing a voltage level of a source voltage equal to or lower than a predetermined reference voltage level; and a processor suitable for computing a detection interval between the first low voltage detection signal and the second low voltage detection signal before the first low voltage detection signal, comparing the computed detection interval and a predetermined threshold detection interval, and determining a subject to manage performing of a recovery operation according to low voltage generation based on a comparison result.

19 Claims, 9 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2017-0018090, filed on Feb. 9, 2017, in the Korean Intellectual Property Office, which is incorporated herein by reference in its entirety.

BACKGROUND

1. Technical Field

Various embodiments generally relate to a semiconductor device, and, more particularly, to a data storage device and an operating method thereof.

2. Related Art

Recently, the paradigm for the computer environment has been changed into ubiquitous computing so that computer systems can be used anytime and anywhere. Due to this fact, the use of portable electronic devices such as mobile phones, digital cameras, and notebook computers has rapidly increased. In general, portable electronic devices use a data storage device (also referred to as a memory system) which uses a memory device for storing data to be used in the portable electronic devices.

A data storage device using a memory device has excellent stability and durability because it does not include a mechanical driving unit. Also, a data storage device using a memory device is advantageous in that it may access data faster and consume less power. Non-limiting examples of a data storage device having such advantages include a universal serial bus (USB) memory device, a memory card having various interfaces, a universal flash storage (UFS) device, and a solid-state drive (SSD).

SUMMARY

Various embodiments are directed to a data storage device capable of operating stably even in a situation where low voltages are generated frequently, and an operating method thereof.

In an embodiment, a data storage device may include: a nonvolatile memory device; a power management unit suitable for outputting first and second low voltage detection signals, each low voltage detection signal representing a voltage level of a source voltage equal to or lower than a predetermined reference voltage level; and a processor suitable for computing a detection interval between the first low voltage detection signal and the second low voltage detection signal before the first low voltage detection signal, comparing the computed detection interval and a predetermined threshold detection interval, and determining a subject to manage performing of a recovery operation according to low voltage generation based on a comparison result.

In an embodiment, a method for operating a data storage device may include: determining whether a low voltage detection signal including first and second low voltage detection signals, each representing that a voltage level of a source voltage is equal to or lower than a predetermined reference voltage level, is received; computing a detection interval between the first low voltage detection signal and the second low voltage detection signal before the first low voltage detection signal; and determining a subject to manage performing of a recovery operation according to low voltage generation, based on a comparison result between the computed detection interval and a predetermined threshold detection interval.

According to the embodiments, depending on an interval with which a low voltage level is detected, whether to perform a recovery operation by an instruction from a host device or perform a recovery operation independently in a data storage device may be determined.

As a consequence, it is possible to prevent occurrence of a bottleneck phenomenon of an entire system due to frequent resets of the data storage device attributable to frequent generation of low voltages.

DETAILED DESCRIPTION

Hereinafter, a data storage device and an operating method thereof will be described below with reference to the accompanying drawings through various examples of embodiments. The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 1:
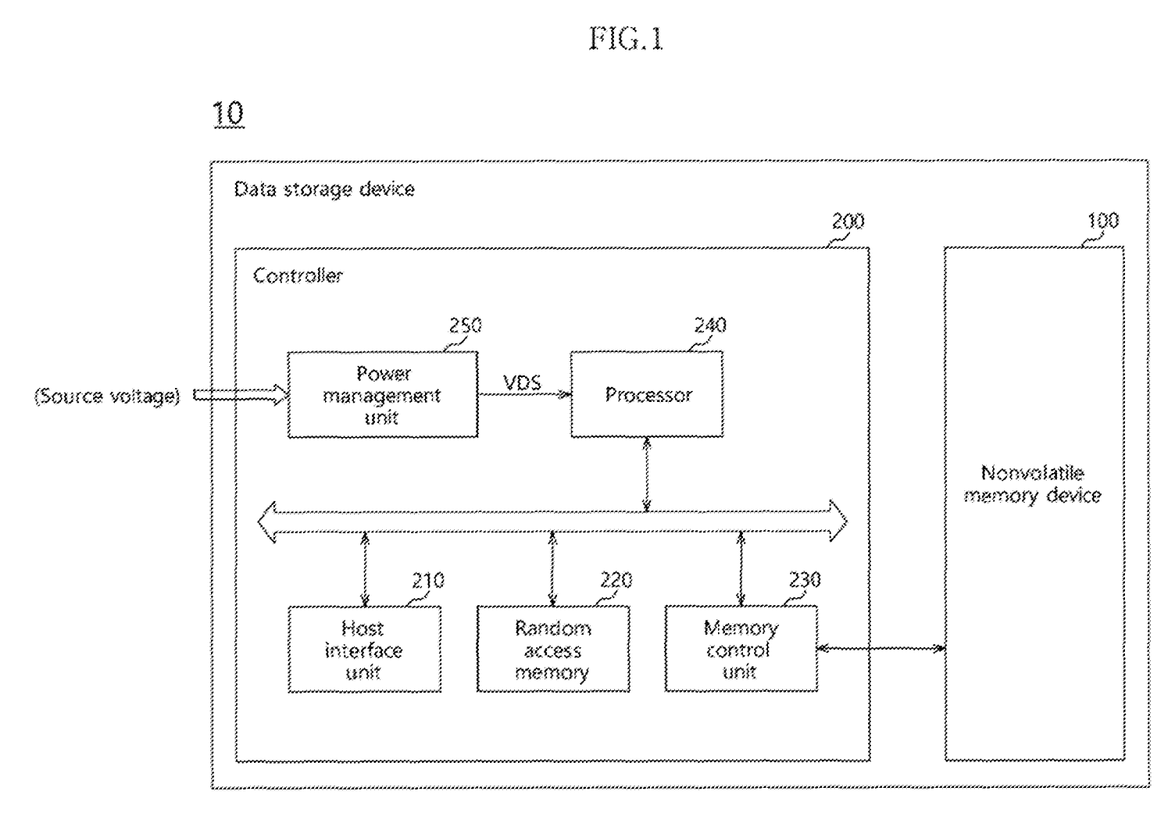
FIG. 1 is a block diagram illustrating a data storage device in accordance with an embodiment of the present disclosure.

FIG. 1 is a block diagram illustrating a data storage device 10 in accordance with an embodiment.

Referring to FIG. 1, the data storage device 10 may store data to be accessed by a host device (not shown) such as a mobile phone, an MP3 player, a laptop computer, a desktop computer, a game player, a television (TV), an in-vehicle infotainment system, and so forth. The data storage device 10 may also be referred to as a memory system.

The data storage device 10 may be implemented with any one of various kinds of storage devices according to the protocol of an interface which is electrically coupled with the host device. For example, the data storage device 10 may be implemented with any one of various kinds of storage devices such as a solid-state drive (SSD), a multimedia card such as an MMC, an eMMC, an RS-MMC and a micro-MMC, a secure digital card such as an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-e) card type storage device, a compact flash (CF) card, a smart media card, a memory stick, and so forth.

The data storage device 10 may be implemented with any one among various kinds of package types. For example, the data storage device 10 may be implemented with any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 10 may include a nonvolatile memory device 100 and a controller 200.

The nonvolatile memory device 100 may operate as the storage medium of the data storage device 10. The nonvolatile memory device 100 may be implemented with any one of various types of nonvolatile memory devices such as a NAND flash memory device, a NOR flash memory device, a ferroelectric random-access memory (FRAM) using a ferroelectric capacitor, a magnetic random-access memory (MRAM) using a tunneling magneto-resistive (TMR) layer, a phase change random-access memory (PRAM) using a chalcogenide alloy, and a resistive random-access memory (RRAM or ReRAM) using a transition metal compound, according to memory cells.

While FIG. 1 illustrates that the data storage device 10 includes one nonvolatile memory device 100, this is only an example, and the data storage device 10 may include a plurality of nonvolatile memory devices. The embodiment may be applied in the same manner to a data storage device including a plurality of nonvolatile memory devices.

The nonvolatile memory device 100 may include a memory cell array (not shown) which has a plurality of memory cells respectively disposed at regions where a plurality of bit lines (not shown) and a plurality of word lines (not shown) intersect with each other.

The nonvolatile memory device 100 may include a plurality of memory blocks (not shown), and each memory block may include a plurality of pages.

The controller 200 may control the various operations of the data storage device 10. The controller 200 may decode and drive a code type instruction or algorithm such as a firmware or a software. The controller 200 may be embodied in the form of a hardware or in the combined form of a hardware and a software.

The controller 200 may include a host interface unit 210, a random-access memory 220, a memory control unit 230, a processor 240, and a power management unit 250. While not shown in FIG. 1, the controller 200 may further include an error correction code (ECC) unit (not shown). The ECC unit may generate parity data for write data to be transmitted to the nonvolatile memory device 100 in response to a write request from the host device and may detect and correct an error of data read out from the nonvolatile memory device 100 in response to a read request from the host device, based on the parity data. The error correction code (ECC) unit may be included in the memory control unit 230.

The host interface unit 210 may interface the host device with the data storage device 10 in correspondence to a protocol of the host device. For example, the host interface unit 210 may communicate with the host device through any suitable protocol including universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-e) protocols.

The random-access memory 220 may store a firmware or a software to be driven by the processor 240. Further, the random-access memory 220 may be configured to store data necessary for driving the software or the software. That is to say, the random-access memory 220 may operate as a working memory of the processor 240.

The random-access memory 220 may be configured to temporarily store data to be transmitted from the host device to the nonvolatile memory device 100 or data to be transmitted from the nonvolatile memory device 100 to the host device. In other words, the random-access memory 220 may operate as a buffer memory.

The memory control unit 230 may control the nonvolatile memory device 100 according to control of the processor 240. The memory control unit 230 may also be referred to as a memory interface unit. The memory control unit 230 may generate control signals according to control of the processor 240, and provide the generated control signals to the nonvolatile memory device 100. The control signals may include a command, an address, and so forth, for controlling the nonvolatile memory device 100.

For example, the memory control unit 230 may provide a write request from the host device, a control signal corresponding to a logical address and write data from the host device, to the nonvolatile memory device 100. Moreover, the memory control unit 230 may provide a read request from the host device and a control signal corresponding to a logical address, to the nonvolatile memory device 100, and may be provided with read data read out from the nonvolatile memory device 100.

The processor 240 may control the various operations of the controller 200. The processor 240 may drive the code type instruction or algorithm, that is, a software, loaded in the random-access memory 220, and control operations of internal function blocks therein. The processor 240 may include function blocks (not shown) necessary for driving the software. The processor 240 may be configured, for example, by a micro control unit (MCU) or a central processing unit (CPU).

The power management unit 250 may be configured to provide operating voltages to the internal function blocks of the data storage device 10 (for example, the nonvolatile memory device 100 and the controller 200). For example, the power management unit 250 may be configured to generate a memory operating voltage to be supplied to the nonvolatile memory device 100 and a control operating voltage to be supplied to the controller 200 based on a source voltage inputted from an exterior, for example, the host device, and provide the generated memory operating voltage and control operating voltage to the nonvolatile memory device 100 and the controller 200, respectively.

The power management unit 250 may be configured by a power supply, a power management integrated circuit (PMIC), or the like. The power management unit 250 may manage power to be used in the operation of the data storage device 10. For example, the power management unit 250 may manage power modes (for example, a normal mode and a power-saving mode) of the data storage device 10 according to control of the processor 240.

The power management unit 250 may detect whether the voltage level of the source voltage inputted from the exterior is out of a predetermined range of a reference voltage level. For example, the range of reference voltage level may be equal to or higher (or greater) than a first reference voltage level and equal to or lower (or less) than a second reference voltage level. In some embodiments, the first reference voltage level may correspond to, but not limited to, a minimum operating voltage of the nonvolatile memory device 100 or the controller 200, and the second reference voltage level may correspond to, but not limited to, a normal operating voltage of the nonvolatile memory device 100 or the controller 200.

If the voltage level of the source voltage is included in the range of the reference voltage level, the power management unit 250 may determine that the voltage level of the source voltage is a normal voltage level. In contrast, if the voltage level of the source voltage inputted from the exterior is out of the range of the reference voltage level and is lower than the first reference voltage level, the power management unit 250 may determine that the voltage level of the source voltage is a low voltage level.

The power management unit 250 may provide a detection signal for the voltage level of the source voltage, that is, a voltage level detection signal VDS, to the processor 240. In some embodiments, the voltage level detection signal VDS may include one of a normal voltage detection signal NVDS and a low voltage detection signal LVDS.

For example, if the voltage level of the source voltage is determined to be a normal voltage level, the power management unit 250 may provide the normal voltage detection signal NVDS to the processor 240. In contrast, if the voltage level of the source voltage is determined to be a low voltage level, the power management unit 250 may transmit the low voltage detection signal LVDS to the processor 240.

Figure 2:
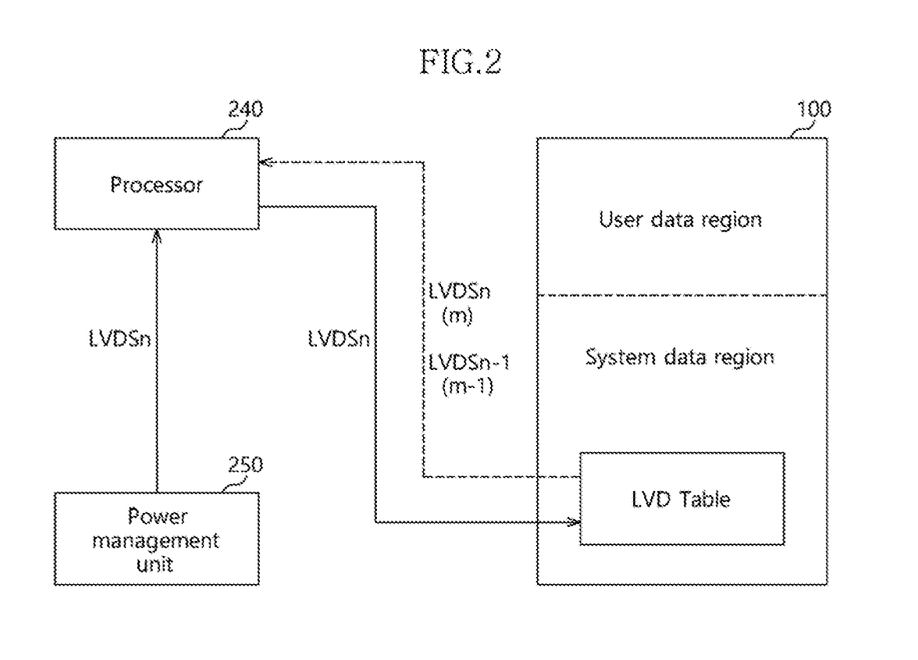
FIG. 2 is a diagram illustrating operations for a processor to store a low voltage detection signal and a corresponding serial number matched thereto, in a low voltage detection table, and to refer to the low voltage detection table for computation of a detection interval.
Figure 3:
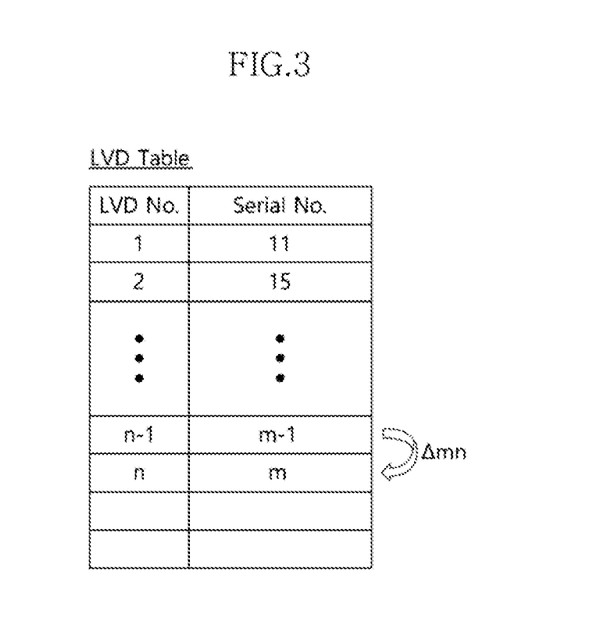
FIG. 3 is a diagram illustrating an example of a low voltage detection table in accordance with an embodiment of the present disclosure.

FIG. 2 is a diagram illustrating operations for the processor 240 to store a low voltage detection signal and a corresponding serial number matched thereto, in a low voltage detection (LVD) table, each time the low voltage level is detected, and to refer to the low voltage detection table for computation of a detection interval. FIG. 3 is a diagram illustrating an example of the low voltage detection (LVD) table in accordance with an embodiment of the present disclosure.

Referring to FIG. 2, if the voltage level of the source voltage inputted from the exterior is determined to be a low voltage level, the power management unit 250 may transmit the low voltage detection signal LVDS to the processor 240. As an example, it is assumed that the power management unit 250 transmits an $n^{th}$ low voltage detection signal LVDSn to the processor 240.

The processor 240 may store the received $n^{th}$ low voltage detection signal LVDSn and a corresponding serial number matched thereto, in a low voltage detection table LVD Table which is defined in a system data region of the nonvolatile memory device 100. The nonvolatile memory device 100 includes the system data region and a user data region.

Referring to FIG. 3, the low voltage detection table LVD Table may include a first region where a low voltage detection signal number LVD No. is stored and a second region where a corresponding serial number Serial No. is stored.

The low voltage detection signal number LVD No. may be expressed to correspond to the count of low voltage detection signals received from the power management unit 250. For example, without a limiting sense, the low voltage detection signal number LVD No. of a low voltage detection signal received first from the power management unit 250 may be expressed as '1,' the low voltage detection signal number LVD No. of a low voltage detection signal received second from the power management unit 250 may be expressed as '2,' and the low voltage detection signal number LVD No. of a low voltage detection signal received $n^{th}$ from the power management unit 250 may be expressed as 'n.'

The serial number Serial No. as a number that increases in proportion to time may be expressed to correspond to the operation sequence of the nonvolatile memory device 100. For example, each time one operation is performed in the nonvolatile memory device 100, the serial number Serial No. may be increased by 1. In other words, each time the nonvolatile memory device 100 performs one of a read operation, a write operation and other operations in response to a request from the host device, the serial number Serial No. may be increased by 1. Hence, the serial number Serial No. may correspond to the count of operations performed in the nonvolatile memory device 100.

The processor 240 may control the nonvolatile memory device 100 to store the number LVD No. of a low voltage detection signal received from the power management unit 250, in the first region of the low voltage detection table LVD Table, and store a serial number Serial No. corresponding to a corresponding operation, in the second region of the low voltage detection table LVD Table. In the present embodiment, serial numbers Serial Nos. of the low voltage detection signals stored in the low voltage detection table LVD Table may be used as the number of times when low voltage levels are detected.

Each time a low voltage detection signal is received from the power management unit 250, the processor 240 may compute a difference value (hereinafter, referred to as a 'detection interval') between a detection time (hereinafter, referred to as a 'first detection time') corresponding to a currently received low voltage detection signal (hereinafter, referred to as a 'first low voltage detection signal') and a detection time (hereinafter, referred to as a 'second detection time') corresponding to an immediately previously received low voltage detection signal (hereinafter, referred to as a 'second low voltage detection signal'), by referring to the low voltage detection table LVD Table.

For example, if the $n^{th}$ low voltage detection signal LVDSn is received from the power management unit 250, the processor 240 may store the number 'n' of the $n^{th}$ low voltage detection signal LVDSn and a corresponding serial number 'm' matched thereto, in the low voltage detection table LVD Table. Thereafter, the processor 240 may compute a difference value between the serial number 'm' for the $n^{th}$ low voltage detection signal LVDSn and a serial number 'm−1' for an $(n-1)^{th}$ low voltage detection signal LVDSn−1, that is, a detection interval Δmn, by referring to the low voltage detection table LVD Table.

An increase in the detection interval may mean an increase in the count of operations performed in the nonvolatile memory device 100 between the first detection time corresponding to the first low voltage detection signal and the second detection time corresponding to the second low voltage detection signal. That is to say, an increase in the detection interval may mean that a count by which low voltages are detected within a predetermined period decreases.

Similarly, a decrease in the detection interval may mean a decrease in the count of operations performed in the nonvolatile memory device 100 between the first detection time corresponding to the first low voltage detection signal and the second detection time corresponding to the second low voltage detection signal. That is to say, a decrease in the detection interval may mean that a count of detected low voltages within a predetermined period increases.

The processor 240 may compare a computed detection interval and a predetermined threshold detection interval. The processor 240 may determine whether the host or the data storage device will manage the performing of a recovery operation according to generation of a low voltage, based on a result of comparing the computed detection interval and the threshold detection interval. In other words, the processor 240 may cause the host device to manage the performing of a recovery operation or the data storage device 10 to manage the performing of a recovery operation regardless of the host device, based on a result of comparing the computed detection interval and the threshold detection interval.

For example, if the computed detection interval is longer the threshold detection interval, the processor 240 may operate to cause the host device to manage the performing of a recovery operation. To this end, the processor 240 may reset the data storage device 10. Also, the processor 240 may control the data storage device 10 which is completely reset, to retain a standby state until a next request is received from the host device. As the data storage device 10 is reset in this way, all the requests and data received from the host device before the data storage device 10 is reset and the data read out from the nonvolatile memory device 100 may be erased. Namely, all the requests received from the host device and queued in a request queue (not shown) of the controller 200 and the write data and/or read data stored in the random-access memory 220 may be erased.

As the data storage device 10 is reset, the host device may determine that it is a situation where a low voltage level is detected, and retransmit a request which is not completely performed at a time when the data storage device 10 is reset (hereinafter, referred to as an 'uncompleted request') or a request which is not processed at the time when the data storage device 10 is reset (hereinafter, referred to as an 'unprocessed request'), to the data storage device 10 which is completely reset. An uncompleted request may mean a request which is not completely performed due to the reset of the data storage device 10 while the request is being performed. The "being performed" may mean a state in which data is being transmitted from the controller 200 to the nonvolatile memory device 100 or from the nonvolatile memory device 100 to the controller 200 in response to a corresponding request, and the "not completely performed" may mean that transmission of data is not completed.

The unprocessed request may mean a request which is erased from the request queue of the controller 200 due to the reset of the data storage device 10 in a state in which the request is queued in the request queue, that is, in a state in which the request is in a standby state to be performed.

The processor 240 may control the nonvolatile memory device 100 by using the memory control unit 230, to process the requests received from the host device.

Meanwhile, if the computed detection interval is shorter the threshold detection interval, the processor 240 may operate to cause the data storage device 10 to manage the performing of a recovery operation regardless of the host device. To this end, the processor 240 may interrupt the operation of the nonvolatile memory device 100 which is performing an operation for a certain request, and determine whether a normal voltage detection signal is received from the power management unit 250. If a normal voltage detection signal is received from the power management unit 250, the processor 240 may determine that the state of a currently inputted voltage is stable and reset the memory control unit 230.

As only the memory control unit 230 is reset in this way, the requests received from the host device and queued in the request queue and the write data and/or read data stored in the random-access memory 220 may not be erased, and the control signals and data stored in the memory control unit 230 may be erased.

As described above, the memory control unit 230 may generate and store control signals to be provided to the nonvolatile memory device 100, based on the requests received from the host device. Further, the memory control unit 230 may store data to be provided to the nonvolatile memory device 100 (that is, write data) or data provided from the nonvolatile memory device 100 (that is, read data).

That is to say, the control signals, write data and/or read data stored in the memory control unit 230 at a time when the memory control unit 230 is reset may be erased by the processor 240.

If the reset of the memory control unit 230 is completed, the processor 240 may control the nonvolatile memory device 100 through the memory control unit 230 such that processing may be performed again from an uncompleted request or an unprocessed request at the first detection time corresponding to the first low voltage detection signal, among the requests received from the host device.

The uncompleted request may be a request which is not completely performed due to the reset of the memory control unit 230 while the request is being performed. The "being performed" may mean a state in which data is being transmitted from the memory control unit 230 to the nonvolatile memory device 100 or from the nonvolatile memory device 100 to the memory control unit 230 in response to a corresponding request, and the "not completely performed" may mean that transmission of data is not completed. The unprocessed request may mean a request which is in a state in which the request is queued in the request queue of the controller 200, that is, in a state in which the request is in a standby state to be performed, and for which a corresponding control signal is not generated yet.

The processor 240 may control the nonvolatile memory device 100 through the memory control unit 230 such that a portion of the uncompleted request which is processed till the first detection time is excluded and only a portion of the uncompleted request which is not processed from immediately after the first detection time is processed.

Therefore, in the present embodiment, if a computed detection interval is equal to or shorter than the threshold detection interval, by resetting not the data storage device 10 but the memory control unit 230, a recovery operation according to generation of a low voltage may be performed independently in the data storage device 10 regardless of the host device. As a consequence, it is possible to prevent occurrence of a bottleneck phenomenon of an entire system due to frequent resets of the data storage device 10 attributable to frequent generation of low voltages.

Figure 4:
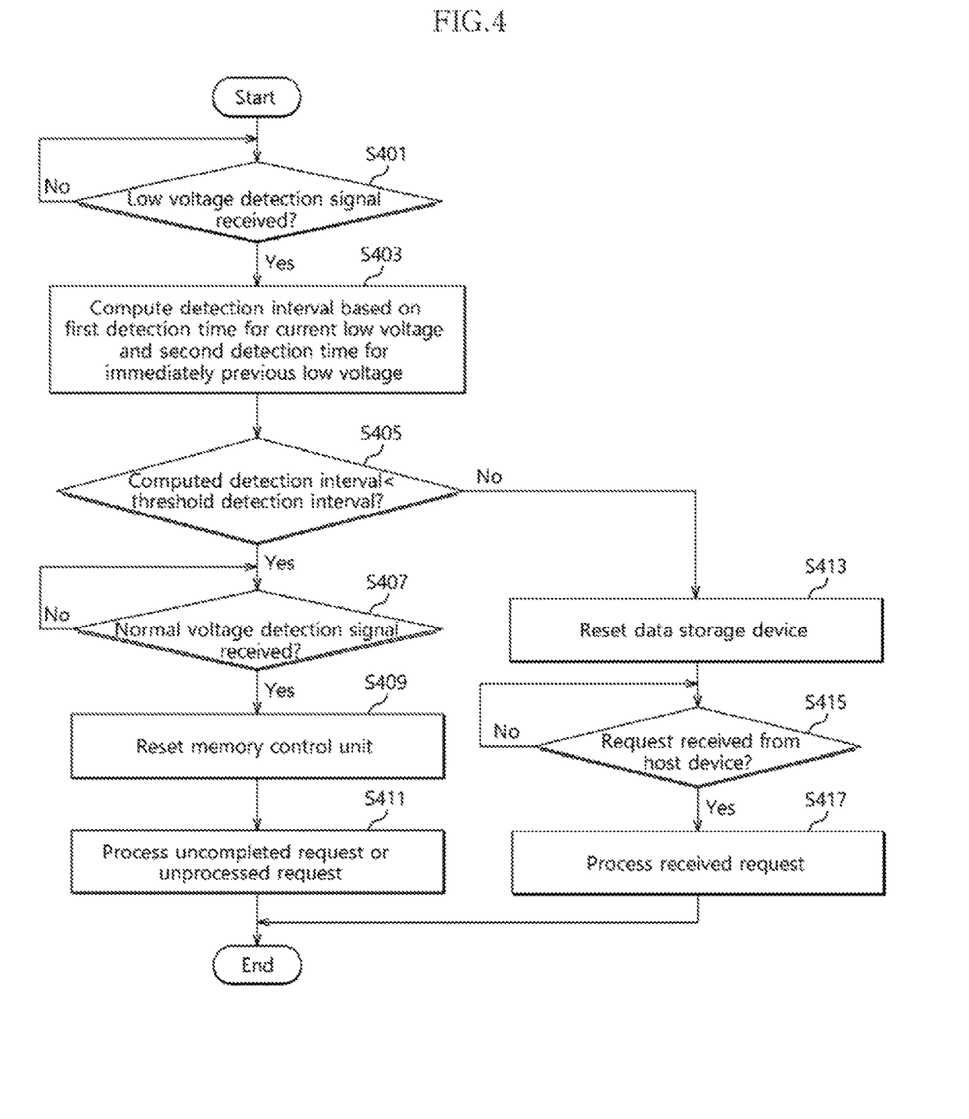
FIG. 4 is a flow chart illustrating a method for operating a data storage device in accordance with an embodiment of the present disclosure.

FIG. 4 is a flow chart illustrating a method for operating a data storage device in accordance with an embodiment of the present disclosure. In explaining the method for operating a data storage device, with reference to FIG. 4, reference may be made to FIGS. 1 to 3.

Referring to FIG. 4, at step S401, the processor 240 of the controller 200 may determine whether a low voltage detection signal is received from the power management unit 250. If a low voltage detection signal is received, step S403 may be performed.

At the step S403, the processor 240 may compute a detection interval as a difference value between a first detection time corresponding to a currently received low voltage detection signal (that is, a first low voltage detection signal), and a second detection time corresponding to an immediately previously received low voltage detection signal (that is, a second low voltage detection signal). While not shown in FIG. 4, at the step S403, the processor 240 may store the number of the currently received first low voltage detection signal and a serial number corresponding thereto, in the low voltage detection table LVD Table.

At step S405, the processor 240 may determine whether the computed detection interval is shorter than a predetermined threshold detection interval. If the computed detection interval is equal to or longer than the threshold detection interval, step S413 may be performed. Conversely, if the computed detection interval is shorter than the threshold detection interval, step S407 may be performed.

At the step S407, the processor 240 may determine whether a normal voltage detection signal is received from the power management unit 250. If a normal voltage detection signal is received, step S409 may be performed. While not shown in FIG. 4, before the step S407, the processor 240 may interrupt the operation of the nonvolatile memory device 100 which is being performed for processing a certain request.

At step S409, the processor 240 may reset the memory control unit 230. Accordingly, all the control signals generated in the memory control unit 230 till the first detection time and the data stored in the memory control unit 230 till the first detection time may be erased.

At step S411, the processor 240 may control the nonvolatile memory device 100 through the memory control unit 230 such that an uncompleted request the processing of which is abnormally interrupted at the first detection time or an unprocessed request which is to be processed first among the requests not processed at the first detection time is processed.

At step S413, the processor 240 may reset the data storage device 10. Accordingly, all the requests received from the host device and stored till the first detection time and the control signals generated till the first detection time may be erased.

At step S415, the processor 240 may determine whether a request is received from the host device. The requests received from the host device may include an uncompleted request or an unprocessed request due to generation of a low voltage. If an uncompleted request or an unprocessed request is received from the host device, step S417 may be performed.

At step S417, the processor 240 may control the nonvolatile memory device 100 through the memory control unit 230, to process the request received from the host device.

Figure 5:
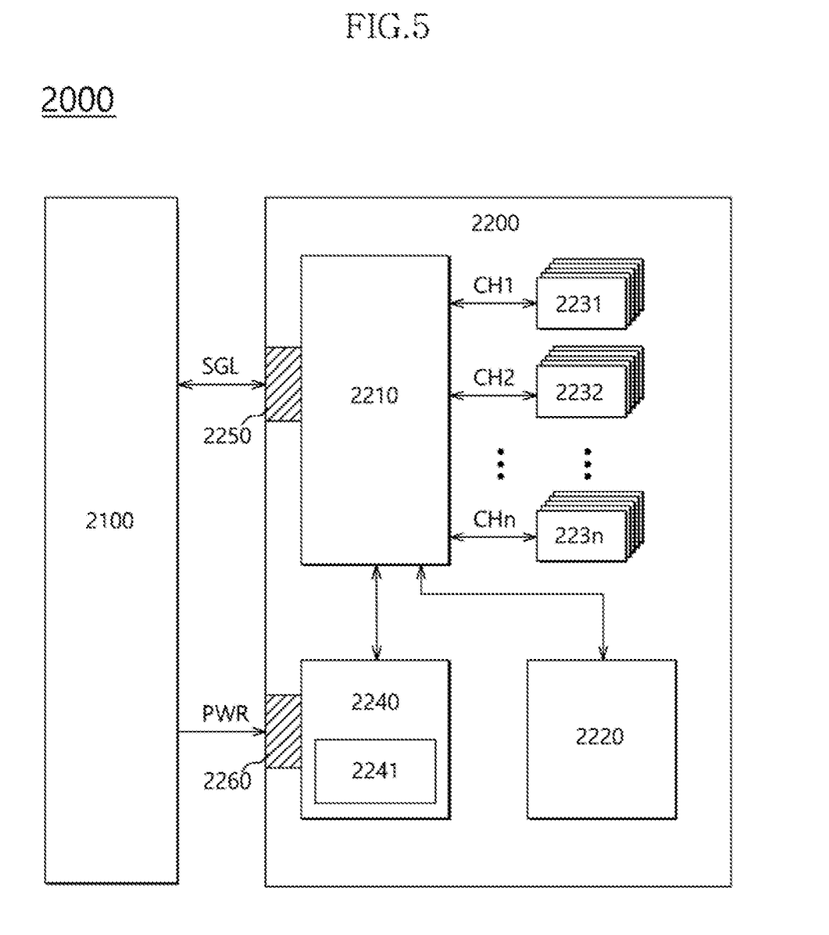
FIG. 5 is a diagram illustrating an example of a data processing system including a solid-state drive (SSD) according to an embodiment of the present disclosure.

FIG. 5 is a diagram illustrating an example of a data processing system 2000 including a solid-state drive (SSD) 2200 according to an embodiment of the present disclosure. Referring to FIG. 5, the data processing system 2000 may include a host device 2100 and the SSD 2200.

The SSD 2200 may include a controller 2210, a buffer memory device 2220, a plurality of nonvolatile memory devices 2231 to 223n, a power supply 2240, a signal connector 2250, and a power connector 2260.

The controller 2210 may control an overall operation of the SSD 2200.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host device 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn, respectively. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host device 2100 through the signal connector 2250. The signal SGL may include a command, an address, data, and the like. The signal connector 2250 may be configured of various types of connectors according to an interfacing method between the host device 2100 and the SSD 2200.

Figure 6:
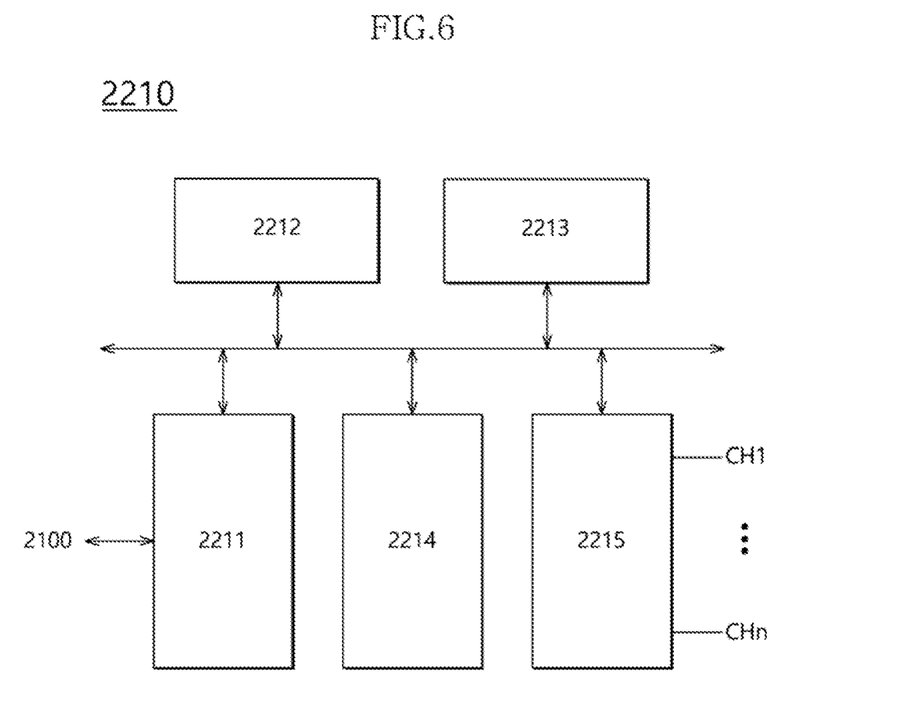
FIG. 6 is a diagram illustrating an example of a controller illustrated in FIG. 5.

FIG. 6 is a diagram illustrating an example of the controller 2210 of FIG. 5. Referring to FIG. 6, the controller 2210 may include a host interface unit 2211, a control unit 2212, a random-access memory (RAM) 2213, an error correction code (ECC) unit 2214, and a memory interface unit 2215.

The host interface unit 2211 may perform interfacing between the host device 2100 and the SSD 2200 according to a protocol of the host device 2100. For example, the host interface unit 2211 may communicate with the host device 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI express (PCI-e) protocol, and a universal flash storage (UFS) protocol. The host interface unit 2211 may perform a disc emulation function that the host device 2100 recognizes the SSD 2200 as a general-purpose data storage device, for example, a hard disc drive (HDD).

The control unit 2212 may analyze and process the signal SGL received from the host device 2100. The control unit 2212 may control operations of internal functional blocks according to firmware and/or software for driving the SDD 2200. The RAM 2213 may be operated as a working memory for driving the firmware or software.

The ECC unit 2214 may generate parity data for the data to be transferred to at least one of the nonvolatile memory devices 2231 to 223n. The generated parity data may be stored in the nonvolatile memory devices 2231 to 223n together with the data. The ECC unit 2214 may detect errors for data read from at least one of the nonvolatile memory devices 2231 to 223n based on the parity data. When detected errors are within a correctable range, the ECC unit 2214 may correct the detected errors.

The memory interface unit 2215 may provide a control signal such as a command and an address to the nonvolatile memory devices 2231 to 223n according to control of the control unit 2212. The memory interface unit 2215 may exchange data with at least one of the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 7:
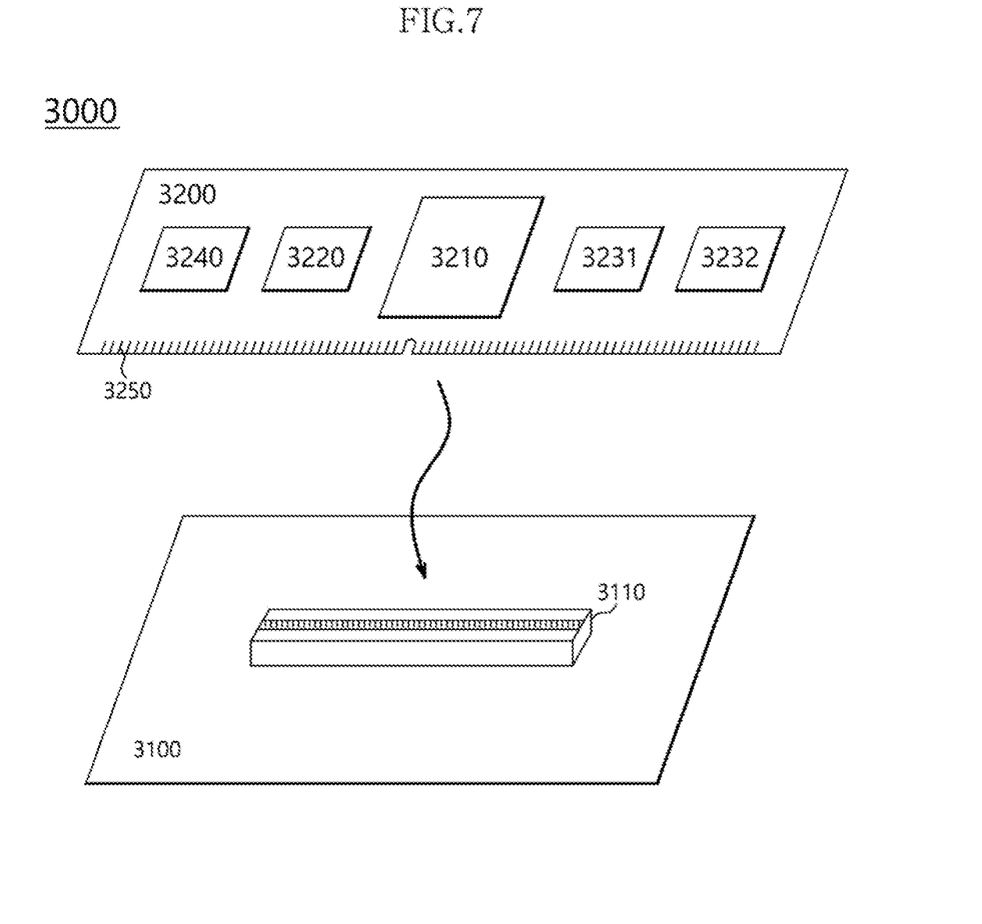
FIG. 7 is a diagram illustrating an example of a data processing system including a data storage device according to an embodiment of the present disclosure.

FIG. 7 is a diagram illustrating an example of a data processing system 3000 including a data storage device 3200 according to an embodiment of the present disclosure. Referring to FIG. 7, the data processing system 3000 may include a host device 3100 and the data storage device 3200.

The host device 3100 may be configured in a board form such as a printed circuit board (PCB). Although not shown in FIG. 7, the host device 3100 may include internal functional blocks configured to perform functions of the host device 3100.

The host device 3100 may include a connection terminal 3110 such as a socket, a slot, or a connector. The data storage device 3200 may be mounted on the connection terminal 3110.

The data storage device 3200 may be configured in a board form such as a PCB. The data storage device 3200 may refer to a memory module or a memory card. The data storage device 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage device 3200. The controller 3210 may be configured to have the same configuration as the controller 2210 illustrated in FIG. 6.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as a storage medium of the data storage device 3200.

The PMIC 3240 may provide power input through the connection terminal 3250 to the inside of the data storage device 3200. The PMIC 3240 may manage the power of the data storage device 3200 according to control of the controller 3210.

The connection terminal 3250 may be coupled to the connection terminal 3110 of the host device 3100. A signal such as a command, an address, and data and power may be transmitted and/or received between the host device 3100 and the data storage device 3200 through the connection terminal 3250. The connection terminal 3250 may be configured in various forms according to an interfacing method between the host device 3100 and the data storage device 3200. The connection terminal 3250 may be arranged in any one side of the data storage device 3200.

Figure 8:
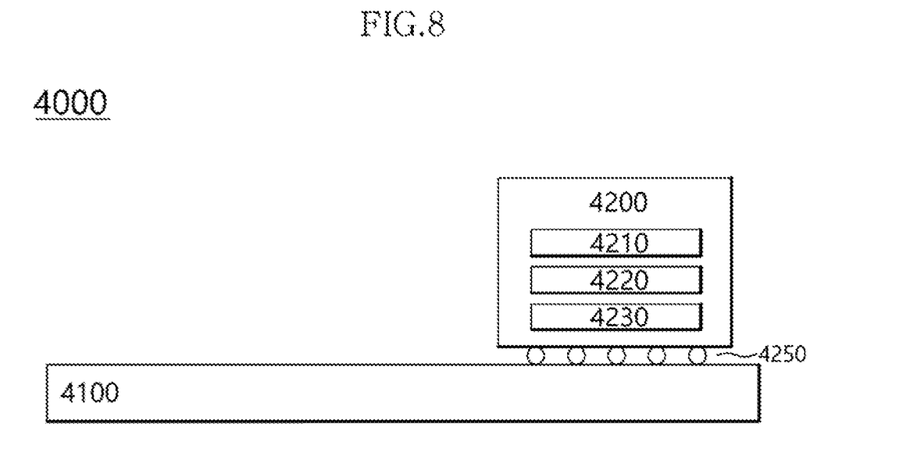
FIG. 8 is a diagram illustrating an example of a data processing system including a data storage device according to an embodiment of the present disclosure.

FIG. 8 is a diagram illustrating an example of a data processing system 4000 including a data storage device 4200 according to an embodiment of the present disclosure. Referring to FIG. 8, the data processing system 4000 may include a host device 4100 and a data storage device 4200.

The host device 4100 may be configured in a board form such as a printed circuit board (PCB). Although not shown in FIG. 8, the host device 4100 may include internal functional blocks configured to perform functions of the host device 4100.

The data storage device 4200 may be configured in a surface mounting packaging form. The data storage device 4200 may be mounted on the host device 4100 through a solder ball 4250. The data storage device 4200 may include a controller 4210, a buffer memory device 4220, and a nonvolatile memory device 4230.

The controller 4210 may control an overall operation of the data storage device 4200. The controller 4210 may be configured to have the same configuration as the controller 2210 illustrated in FIG. 6.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host device 4100 or the nonvolatile memory device 4230 through control of the controller 4210.

The nonvolatile memory device 4230 may be used as a storage medium of the data storage device 4200.

Figure 9:
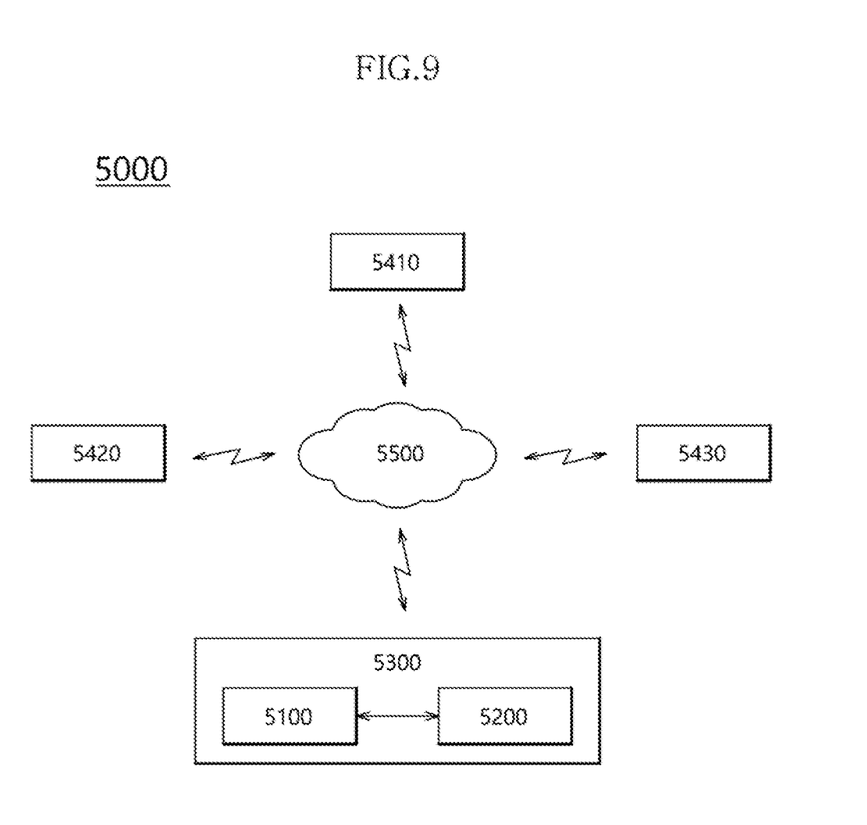
FIG. 9 is a diagram illustrating an example of a network system including a data storage device according to an embodiment of the present disclosure.

FIG. 9 is a diagram illustrating an example of a network system 5000 including a data storage device 5200 according to an embodiment of the present disclosure. Referring to FIG. 9, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host device 5100 and the data storage device 5200. The data storage device 5200 may be configured of the data storage apparatus 10 of FIG. 1, the data storage device 2200 of FIG. 5, the data storage device 3200 of FIG. 7, or the data storage device 4200 of FIG. 8.

Figure 10:
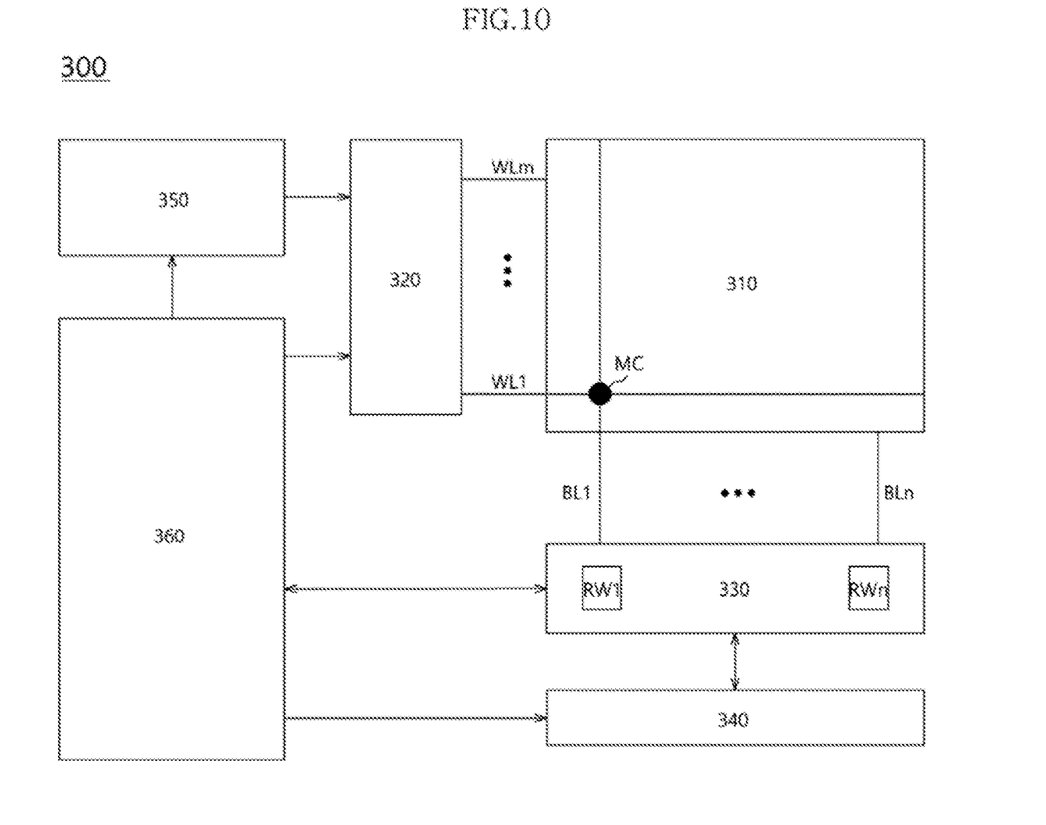
FIG. 10 is a diagram illustrating an example of a nonvolatile memory device included in a data storage device according to an embodiment of the present disclosure.

FIG. 10 is a diagram illustrating an example of a nonvolatile memory device 100 included in a data storage device according to an embodiment of the present disclosure. Referring to FIG. 10, the nonvolatile memory device 100 may include a memory cell array 110, a row decoder 120, a column decoder 140, a data read/write block 130, a voltage generator 150, and a control logic 160.

The memory cell array 110 may include memory cells MC arranged in regions in which word lines WL1 to WLm and bit lines BL1 to BLn cross to each other.

The row decoder 120 may be coupled to the memory cell array 110 through the word lines WL1 to WLm. The row decoder 120 may operate through control of the control logic 160. The row decoder 120 may decode an address provided from an external apparatus (not shown). The row decoder 120 may select and drive the word lines WL1 to WLm based on a decoding result. For example, the row decoder 120 may provide a word line voltage provided from the voltage generator 150 to the word lines WL1 to WLm.

The data read/write block 130 may be coupled to the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as the write driver configured to store data provided from an external apparatus in the memory cell array 110 in a write operation. In another example, the data read/write block 130 may operate as the sense amplifier configured to read data from the memory cell array 110 in a read operation.

The column decoder 140 may operate though control of the control logic 160. The column decoder 140 may decode an address provided from an external apparatus (not shown). The column decoder 140 may couple the read/write circuits RW1 to RWn of the data read/write block 130 corresponding to the bit lines BL1 to BLn and data input/output (I/O) lines (or data I/O buffers) based on a decoding result.

The voltage generator 150 may generate voltages used for an internal operation of the nonvolatile memory device 100. The voltages generated through the voltage generator 150 may be applied to the memory cells of the memory cell array 110. For example, a program voltage generated in a program operation may be applied to word lines of memory cells in which the program operation is to be performed. In another example, an erase voltage generated in an erase operation may be applied to well regions of memory cells in which the erase operation is to be performed. In another example, a read voltage generated in a read operation may be applied to word lines of memory cells in which the read operation is to be performed.

The control logic 160 may control an overall operation of the nonvolatile memory device 100 based on a control signal provided from an external apparatus. For example, the control logic 160 may control an operation of the nonvolatile memory device 100 such as a read operation, a write operation, an erase operation of the nonvolatile memory device 100.

While various embodiments have been described above, it will be understood to those skilled in the art that the embodiments described are examples only. Accordingly, it is noted that the data storage device and the operating method thereof described herein should not be limited based on the described embodiments, and that many other embodiments and variations thereof may be envisaged by those skilled in the art to which the present invention pertains without departing from the scope or spirit of the present invention as defined in the following claims.

What is claimed is:

1. A data storage device comprising:
a nonvolatile memory device;
a power management unit suitable for outputting first and second low voltage detection signals, each low voltage detection signal representing a voltage level of a source voltage equal to or lower than a predetermined reference voltage level; and
a processor suitable for computing a detection interval between the first low voltage detection signal and the second low voltage detection signal before the first low voltage detection signal, comparing the computed detection interval and a predetermined threshold detection interval, and determining a subject to manage performing of a recovery operation according to low voltage generation based on a comparison result.

2. The data storage device according to claim 1, wherein the source voltage is received from a host device.

3. The data storage device according to claim 2, wherein the processor receives the low voltage detection signal from the power management unit, matches a corresponding detection time to the low voltage detection signal, and stores the low voltage detection signal and the corresponding detection time in a low voltage detection table included in the nonvolatile memory device.

4. The data storage device according to claim 3, wherein the processor computes the detection interval based on a first detection time corresponding to the first low voltage detection signal and a second detection time corresponding to the second low voltage detection signal, by referring to the low voltage detection table.

5. The data storage device according to claim 2, further comprising:
a memory control unit suitable for generating a control signal for controlling an operation of the nonvolatile memory device, and providing the generated control signal to the nonvolatile memory device.

6. The data storage device according to claim 5, wherein, when the computed detection interval is shorter than the threshold detection interval, the processor resets the memory control unit, and controls the memory control unit to process the recovery operation for an uncompleted request or an unprocessed request due to the low voltage generation, when reset of the memory control unit is completed.

7. The data storage device according to claim 6, wherein the processor resets the memory control unit when a normal voltage detection signal is received from the power management unit.

8. The data storage device according to claim 7, wherein the normal voltage detection signal represents that the voltage level of the source voltage is greater than the reference voltage level.

9. The data storage device according to claim 5, wherein, when the computed detection interval is longer than the threshold detection interval, the processor resets the data storage device, determines whether a request is received from the host device, and controls the memory control unit to process the request received from the host device.

10. The data storage device according to claim 9, wherein the request received from the host device includes an uncompleted request or an unprocessed request due to the low voltage generation.

11. A method for operating a data storage device, comprising:
determining whether a low voltage detection signal including first and second low voltage detection signals, each representing that a voltage level of a source voltage is equal to or lower than a predetermined reference voltage level, is received;
computing a detection interval between the first low voltage detection signal and the second low voltage detection signal before the first low voltage detection signal; and
determining a subject to manage performing of a recovery operation according to low voltage generation, based on a comparison result between the computed detection interval and a predetermined threshold detection interval.

12. The method according to claim 11, wherein the source voltage is received from a host device.

13. The method according to claim 12, further comprising, before the computing of the detection interval,
storing the received low voltage detection signal and a corresponding detection time matched thereto, in a low voltage detection table included in a nonvolatile memory device.

14. The method according to claim 13, wherein the computing of the detection interval is performed by computing a difference value between a first detection time corresponding to the first low voltage detection signal and a second detection time corresponding to the second low voltage detection signal, by referring to the low voltage detection table.

15. The method according to claim 12, wherein the determining of the subject to manage the performing of the recovery operation comprises determining whether the recovery operation according to the low voltage generation is to be performed by an instruction from the host device or is to be performed independently in the data storage device regardless of the host device.

16. The method according to claim 12, wherein the determining of the subject to manage the performing of the recovery operation comprises:
resetting a memory control unit of the data storage device when the computed detection interval is shorter than the threshold detection interval; and
processing the recovery operation for an uncompleted request or an unprocessed request due to the low voltage generation.

17. The method according to claim 16, further comprising, before the resetting of the memory control unit,
determining whether a normal voltage detection signal, representing that the voltage level of the source voltage is greater than the reference voltage level, is received,
wherein the memory control unit is reset when the normal voltage detection signal is received.

18. The method according to claim 12, wherein the determining of the subject to manage the performing of the recovery operation comprises:
resetting the data storage device when the computed detection interval is longer than the threshold detection interval;
determining whether a request is received from the host device; and
processing, when the request is received from the host device, the corresponding request.

19. The method according to claim 18, wherein the request received from the host device includes an uncompleted request or an unprocessed request due to the low voltage generation.

* * * * *